(12) United States Patent
Sailer

(10) Patent No.: US 9,729,141 B2
(45) Date of Patent: Aug. 8, 2017

(54) ELECTRONIC CIRCUIT ARRANGEMENT FOR USE IN AN EXPLOSIVE AREA

(71) Applicant: ECOM Instruments GmbH, Assamstadt (DE)

(72) Inventor: Axel Sailer, Weikersheim (DE)

(73) Assignee: ECOM Instruments GmbH (DE)

( * ) Notice: Subject to any disclaimer, the term of this patent is extended or adjusted under 35 U.S.C. 154(b) by 447 days.

(21) Appl. No.: 14/323,748

(22) Filed: Jul. 3, 2014

(65) Prior Publication Data

US 2015/0008764 A1 Jan. 8, 2015

(30) Foreign Application Priority Data

Jul. 4, 2013 (DE) ........................ 10 2013 213 042

(51) Int. Cl.
| | | |
|---|---|---|
| *H02B 1/24* | (2006.01) | |
| *H01H 19/64* | (2006.01) | |
| *H01H 31/10* | (2006.01) | |
| *H01H 33/59* | (2006.01) | |
| *H01H 47/00* | (2006.01) | |
| *H01H 85/46* | (2006.01) | |
| *H01H 19/14* | (2006.01) | |
| *H03K 17/687* | (2006.01) | |
| *G06F 13/38* | (2006.01) | |

(52) U.S. Cl.
CPC ......... *H03K 17/687* (2013.01); *G06F 13/382* (2013.01); *Y10T 307/76* (2015.04)

(58) Field of Classification Search
CPC ....... H03K 19/0016; H03K 2217/0009; H03K 2217/0036; H03K 17/005; H03K 17/0406; H03K 17/06; H03K 17/08; H03K 17/082; H03K 17/10; H03K 17/102; H03K 17/13; H03K 17/136; H03K 17/14
USPC ....................................................... 307/115
See application file for complete search history.

(56) References Cited

U.S. PATENT DOCUMENTS

| | | | | |
|---|---|---|---|---|
| 5,859,772 | A  * | 1/1999 | Hilpert ................. | H02H 7/1227 327/405 |
| 6,943,532 | B1 * | 9/2005 | Kouwa ................. | H02J 7/1461 322/24 |
| 8,369,053 | B2 * | 2/2013 | Moronval ........... | H01L 27/0248 361/111 |
| 2005/0063129 | A1 | 3/2005 | Kato | |
| 2006/0087778 | A1* | 4/2006 | Hau ........................ | H02H 7/06 361/56 |
| 2006/0087787 | A1* | 4/2006 | Beyler .................... | F02P 3/053 361/100 |
| 2006/0114634 | A1 | 6/2006 | Terada | |

(Continued)

*Primary Examiner* — Jared Fureman
*Assistant Examiner* — Esayas Yeshaw
(74) *Attorney, Agent, or Firm* — Fishman Stewart PLLC

(57) ABSTRACT

An electronic circuit arrangement for use in an explosive area may include an electrical signal line, which connects an electrical input connector to an electrical output connector, and an electrical earth line, which can be or is electrically connected to the electrical signal line by at least one electrical earthing line. An inductive component and a semiconductor switch may be arranged in the at least one earthing line. The semiconductor switch may be switched between a closed state, in which the signal line is electrically connected via the at least one earthing line to the earth line, and an open state, in which this electrical connection is interrupted.

20 Claims, 1 Drawing Sheet

(56) References Cited

U.S. PATENT DOCUMENTS

| | | | |
|---|---|---|---|
| 2006/0152865 A1* | 7/2006 | Nair | F02D 41/20 361/35 |
| 2009/0195946 A1* | 8/2009 | Kleveland | H01L 27/0251 361/56 |
| 2014/0368964 A1* | 12/2014 | Nakano | F02P 3/0453 361/256 |

* cited by examiner

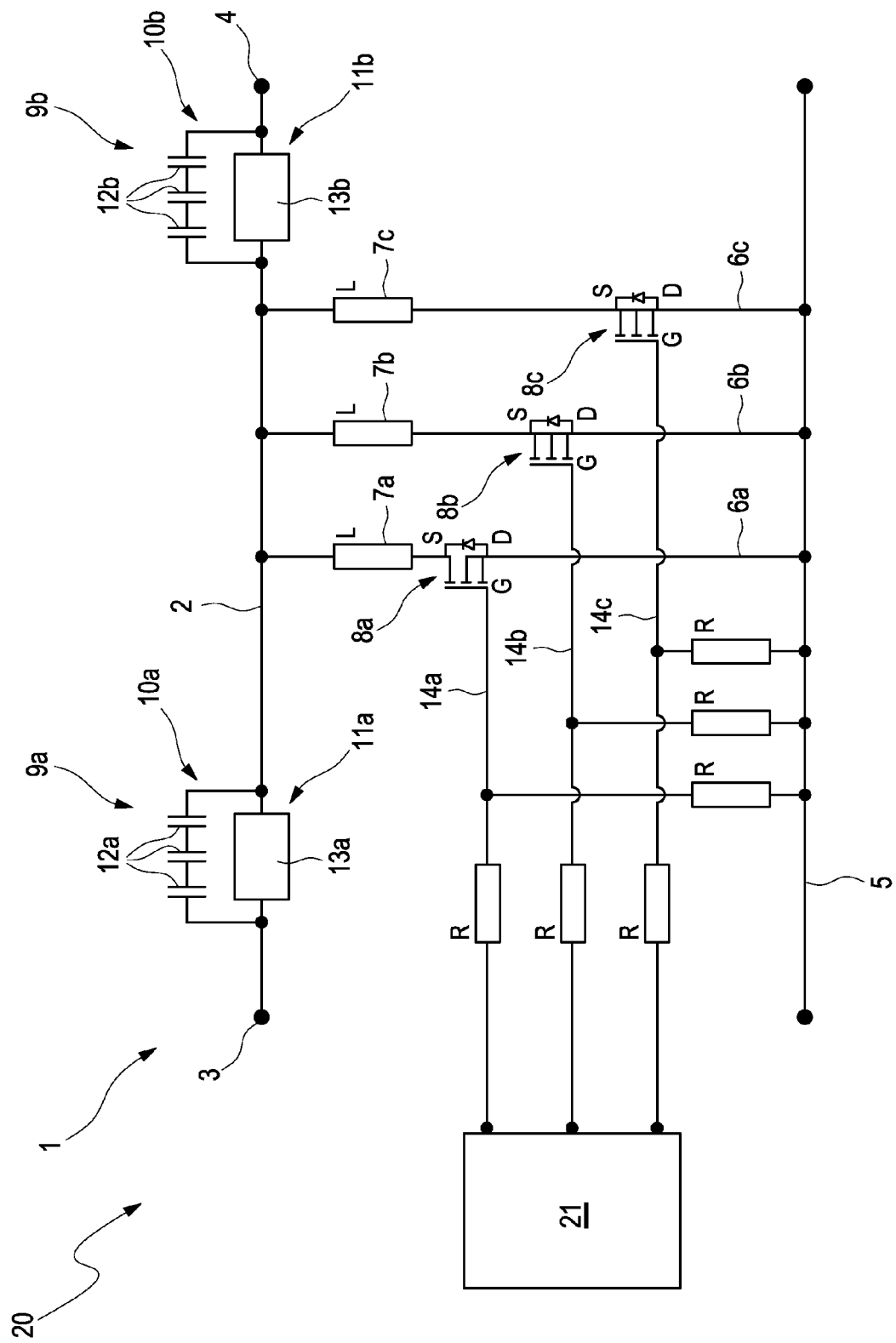

ELECTRONIC CIRCUIT ARRANGEMENT FOR USE IN AN EXPLOSIVE AREA

CROSS-REFERENCE TO RELATED APPLICATIONS

This application claims priority to German Patent Application No. 10 2013 213 042.2, filed Jul. 4, 2013, the contents of which are hereby incorporated by reference in their entirety.

TECHNICAL FIELD

The present invention relates to an electronic circuit arrangement for use in an explosive area and also an electronic circuit system with such an electronic circuit arrangement. Such explosive areas may in particular be what are known as "Zone 1" explosive areas. The invention furthermore relates to an electronic device, particularly a computer or a mobile telephone, having such an electronic circuit arrangement or having such an electronic circuit system.

BACKGROUND

Many electronic devices, for example modern computers or mobile telephones, have electronic interfaces having one or a plurality of connecting elements for communication with other devices, which are attached externally on the device housing. Such an interface constitutes a potential hazard for the use of electronic devices in explosive areas, as a spark may be produced by electrical energy provided at the connecting elements of the interface and a gas/air mixture present in the explosive area can be ignited in this manner.

To prevent this, in conventional electronic devices, electronic protection circuits are provided, which are often technically complex to realise, however, and thus have a detrimental effect on the production costs of the electronic device; in addition, the performance of the interface, may be impaired in an unexpected manner by means of such a protective circuit, particularly with regards to the data transmission rates realisable by means of the interface.

During practical operation of the electronic devices, the case also often arises, that the interface provided on the device housing should only be used exclusively outside the explosive area and consequently must not be located within the explosive area in an activated state.

SUMMARY

The present invention is therefore based on the object of providing a circuit arrangement for line safeguarding, by means of which interfaces of electronic devices in explosive areas can be deactivated in a safe manner, without this leading to impairments with regards to the performance of the interface in an active state of the interface outside of the explosive area.

This object is achieved by means of the subject matter of the independent patent claims. Preferred embodiments are the subject matter of the dependent claims.

The invention is based on the general idea of providing an electronic circuit arrangement having an electrical signal line with at least two controllable earthing lines, by means of which the signal line can be earthed if required, the earthing lines each having an inductive component and a semiconductor switch. The inductive component and the semiconductor switch are electrically connected to one another in series in the respective earthing line in this case. By switching over at least one of the semiconductor switches from an open state to a closed state by means of the two earthing lines, the signal line can be electrically connected via the respective earthing lead to an earth line, so that the signal line is earthed if required in this manner. Such an earthing can take place if the electronic circuit arrangement or the device using the electronic circuit arrangement is used in an explosive area. By earthing the signal line, it is ensured that no more electrical energy is provided at the output connector of the signal line. Consequently, the device using the electronic circuit arrangement is in an explosion-proof state.

The circuit arrangement according to the invention is therefore particularly suited to use in connection with electronic interfaces, particularly high-speed interfaces, such as e.g. modern USB interfaces, the signal line(s) of which has/have connecting elements externally on the device housing. Outside of the explosive area, by opening the semiconductor switch, i.e. by switching the semiconductor switch over to the open state, the electrical connection between the signal line and the electrical earth line can be interrupted, so that electrical energy and thus electrical signals can be transported via the signal line and supplied at the electrical output connector of the interface.

The inductive component arranged in the respective earthing line in accordance with the invention ensures that the signal line for high-frequency signals is not earthed even in the case of an open semiconductor switch. As a charge-carrier barrier layer present in the semiconductor switch can act as a capacitive component for the high-frequency electrical signals flowing via the signal line, so that even in the actually open state, in which the connection between signal and earth lines is interrupted, the semiconductor switch "connects through" for high-frequency signals and thus connects the signal line to the earth line in an undesired manner, that is to say earths the same. The capacitive property of the semiconductor switch, that is to say a complex electrical resistance falling with increasing frequency, is counteracted in the earthing line by means of the frequency-dependent electrical resistance of the inductive component, which increases with increasing frequency. The inductive component therefore ensures the desired separation of the signal line from the earth line in the open state of the semiconductor switch, even for high-frequency signals, as are used in modern high-speed interfaces, for example USB interfaces.

In order to ensure that the signal line is reliably connected to the electrical earth line for earthing, in the circuit arrangement according to the invention, not just one single earthing line is provided, rather, in addition to a first earthing line, an additional redundant second earthing line connected parallel to the first earthing line is provided. The two earthing lines in each case connect the electrical signal line in a switchable manner to the electrical earth line, i.e. one inductive component in each case and a semiconductor switch connected in series thereto is arranged in each of the two earthing lines. The electronic circuit arrangement according to the invention therefore enables a very reliable deactivation of the signal line with respect to electronic interfaces, it being possible to keep the production costs low owing to the electrical/electronic components used in the electronic circuit arrangement, which can be obtained commercially in large quantities and therefore inexpensively. The use of the electronic circuit arrangement according to the invention is particularly suitable in connection with fast electronic interfaces, the performance thereof, particularly with regards to maximum achievable data transmission rate, should not be impaired during active operation of the interface outside of an explosive area.

In a preferred embodiment, the semiconductor switch comprises or is a transistor, that is to say a switchable electronic component.

According to a preferred embodiment, exactly three earthing lines are provided in the electronic circuit arrangement, which in each case connect the signal line in a switchable manner to the earthing line in the form of an electrical parallel circuit and can earth the same in this manner if required. This means that one inductive component in each case and a semiconductor switch electrically connected in series thereto is arranged in each of the three earthing lines. The redundancy compared to a circuit arrangement with just two earthing lines can be increased further by using three earthing lines, which further improves the operational reliability of the entire electronic circuit arrangement compared to an arrangement with just two earthing lines. In a variant, which is particularly simple to realise from a technical standpoint, one idea may even be to provide just one earthing line. An electronic circuit arrangement with exactly two earthing lines fulfils the requirements for galvanically isolated, intrinsically safe circuits of Category "ib", a circuit arrangement with three earthing lines fulfils the requirements for galvanically isolated intrinsically safe circuits of Category "ia".

For further improvement of the operational reliability, at least one parallel circuit with having a first and a second branch can be provided in the signal line according to an advantageous development, at least one capacitive component being arranged in the first branch and a fuse element being arranged in the second branch. The capacitive component can be an electric capacitor in this case, the fuse element can be a conventional fuse component, for example in the form of a conventional electric fuse. A pulsed AC signal provided at the electrical input connector of the electrical signal line having a predetermined DC offset is decomposed at the input of the parallel circuit into an alternating-current voltage portion (AC portion) and a direct-current voltage portion (DC portion). The alternating-current voltage portion of the signal, for example in the case of a square signal or a pulsed signal the rising or falling flank, is, without being influenced by the fuse element, conducted via the first branch, as the capacitive component acts as a high-pass filter. The direct-current voltage portion, which is more energy-rich compared to the alternating-current voltage portion, flows by contrast via the second branch and thus through the fuse element. At the output of the parallel circuit, the original signal form results again by means of the combination of the signals conducted via the two branches, that is to say the AC signal with DC portion called pulsed or square by way of example. By means of the fuse element, it is ensured in this case that the electrical energy transmitted in the signal line does not exceed a maximum permissible peak value; in this case, the fuse element interrupts the electrical connection of the input connector of the signal line to the output connector. In this manner, independently of the earthing according to the invention of the signal line by means of earthing lines, it is additionally ensured that the switching elements are operated in an energy-limited manner. It is prevented by means of the capacitive component provided in the first branch, that the fuse element acting as high-pass filter impairs or eliminates the high-frequency portions of the signal to be transmitted in an undesired manner.

In a particularly preferred embodiment, the fuse element can therefore be constructed as a current-limiting apparatus, in such a manner that it galvanically isolates the input connector of the signal line from the output connector if the electric current flowing through the fuse element exceeds a predetermined maximum value.

Particularly preferably, exactly two of the previously presented parallel circuits, which are electrically connected to one another in series, can be provided in the circuit arrangement. In this manner, the operational reliability of the electronic device using the circuit arrangement can be increased on the basis of the second, redundant parallel circuit, compared to just one single parallel circuit. Particularly preferably, the two parallel circuits are electrically connected to one another in series in such a manner that connecting points for the at least two earthing lines are provided in the signal line between the two electrical parallel circuits.

In order to prevent an undesired short circuit in the capacitive component, particularly an electric capacitor, arranged in the first branch of the parallel circuit, three such capacitive elements can be arranged electrically-connected in series in the first and/or in the second branch. In the case of the occurrence of a short circuit in one or in two of the three capacitive components, there is then still always at least one or two such capacitive components available, in order to prevent a direct electrical connection of the electrical input connector of the signal line to the electrical output connector of the signal line and thus a galvanic bridging of the fuse element. A further advantage of the cascading of such capacitive components consists in the fact that the complex, frequency-dependent electrical resistance can be set up for maintaining a desired characteristic.

According to an advantageous development, the respective semiconductor switch can be switched over between the open and the closed state by means of an electrical control line. Such a control line can interact with a control unit, for example in the manner of a microcontroller or the like, and in this manner ensure the desired earthing of the signal line for the event that the electronic circuit arrangement is used in an explosive area.

Particularly preferably, the semiconductor switch can be a field-effect transistor, the gate connector of which is electrically connected to the control line, the source connector of which is electrically connected to the signal line or the drain connector of which is electrically connected to the earth line. In this manner, the earthing line can be integrated in a simple manner into an available interface having the electrical signal line. Instead of the field-effect transistor, other transistor types, for example a bipolar transistor can also be used.

The invention furthermore relates to an electronic circuit system having an electronic circuit arrangement having one or a plurality of the previously explained features and also having a control unit, by means of which the at least two semiconductor switches can be controlled for switching over between the open and the closed states.

The invention furthermore relates to an electronic device, particularly a computer or a mobile telephone, having a previously presented electronic circuit arrangement or having the previously presented circuit system and also having an external interface, on which the output connector of the signal line is provided.

Further important features and advantages of the invention result from the subclaims, from the drawing and from the associated description of the figures on the basis of the drawing.

It is to be understood that the previously mentioned features and the features which are still to be mentioned in the following, can be used not only in the respectively specified combination, but also in other combinations or alone, without departing from the context of the present invention.

Preferred exemplary embodiments of the invention are illustrated in the drawing and are described in more detail in the following description.

BRIEF DESCRIPTION OF THE DRAWINGS

FIG. 1 illustrates a schematic circuit diagram of an exemplary electronic circuit arrangement.

DETAILED DESCRIPTION

An electronic circuit arrangement according to the invention is shown in the FIG. 1 in a circuit-diagram-like illustration and designated with 1. The electronic circuit arrangement 1 comprises an electrical signal line 2, which connects an electrical input connector 3 to an electrical output connector 4. The electrical output connector 4 can in this case be part of an electrical interface, which is provided on a housing outer side of an electronic device and has one or a plurality of connecting elements. Furthermore, the electronic circuit arrangement 1 comprises an electrical earth line 5. The electrical earth line 5 is or can be electrically connected according to the invention to the electrical signal line 2 by means of at least one first and one second electrical earthing line 6a, 6b. In the example shown in FIG. 1, three such electrical earthing lines 6a, 6b, 6c are provided. Each of the three earthing lines 6a, 6b, 6c has one inductive component 7a, 7b, 7c in each case and also one semiconductor switch 8a, 8b, 8c electrically connected in series in each case. The semiconductor switches 8a, 8b, 8c can be switched over between a closed state, in which the signal line 2 is electrically connected via the respective earthing line 6a, 6b, 6c to the earth line, and an open state, in which this electrical connection is interrupted. To this end, the semiconductor switches 8a, 8b, 8c can be constructed as transistors or comprise such transistors. By setting the closed state in at least one of the three semiconductor switches 8a, 8b, 8c, the signal line 2 is therefore electrically connected to the earth line 5 and earthed in this manner. Such an earthing is necessary if the electronic circuit arrangement 1 and thus the signal line 2 is used in an explosive area, so that the electrical energy supplied at the electrical output connector 4 of the signal line 2 must be prevented from causing a glow or spark ignition in the explosive area. The danger of an undesired glow ignition, for example due to carbon dust deposits, exists in particular in a plug housing assigned to the output connector 4.

The inductive component 7a, 7b, 7c arranged in the respective earthing line 6a, 6b, 6c ensures that the signal line 2 for high-frequency signals is not earthed even in the case of an open semiconductor switch 8a, 8b, 8c. As a charge-carrier barrier layer present in the semiconductor switch 8a, 8b, 8c can act as a capacitive component for the high-frequency electrical signals flowing via the signal line 2, so that even in the actually open state, in which the connection between signal and earth lines 2, 5 is interrupted, the semiconductor switch 8a, 8b, 8c "connects through" for high-frequency signals and thus connects the signal line 2 to the earth line 5 in an undesired manner, that is to say earths the same. The capacitive property of the semiconductor switch 8a, 8b, 8c, that is to say a complex electrical resistance falling with increasing frequency, is counteracted in the earthing line 6a, 6b, 6c by means of the frequency-dependent electrical resistance of the inductive component 7a, 7b, 7c, which increases with increasing frequency. The inductive component 7a, 7b, 7c therefore ensures the desired separation of the signal line from the earth line in the open state of the semiconductor switch 8a, 8b, 8c, even for high-frequency signals, as are used in modern high-speed interfaces, for example USB interfaces. The inductive component 7a, 7b, 7c can preferably have an inductance in the nH range, particularly in the range between 1 and 900 nH.

In the event that the electronic circuit arrangement 1 is not used in an explosive area, all semiconductor switches 8a, 8b, 8c are accordingly switched over to the open state, so that the earthing of the signal line 2 is consequently cancelled and electrical energy and thus also electrical signals can be transmitted from the electrical input connector 3 to the electrical output connector 4.

By using three earthing lines 6a, 6b, 6c, the operational reliability of the electronic circuit arrangement 1 is increased considerably compared to a conventional circuit arrangement having only one earthing line in the sense of triple redundancy. As, if a malfunction occurs in one or two of the three earthing lines, for example in the semiconductor switch 8a of the earthing line 6a in such a manner that the semiconductor switch 8a cannot be switched over to the closed state because of this malfunction, there are still the remaining semiconductor switches 8b, 8c available for earthing the signal line. In a variant of the example of FIG. 1, which is simplified considerably from a technical standpoint, one idea may be to provide just one single earthing line 6a.

According to the invention, at least two electrical earthing lines 8a, 8b are required, in order to ensure double redundancy with respect to the earthing lines 6a, 6b. In the example shown in FIG. 1, in which triple redundancy with three earthing lines 6a, 6b, 6c is shown, the operational reliability is therefore additionally increased compared to a circuit arrangement with double redundancy. In development variants, a still greater number of earthing lines 6a, 6b, 6c is of course possible, in order to increase the operational reliability further if required.

It can furthermore be drawn from FIG. 1, that two parallel circuits 9a, 9b having a first and a second branch 10a, 11a, 10b, 11b in each case are provided in the electrical signal line 2. In a simplified variant, however, just one such parallel circuit 9a or 9b can be provided and a greater number can also be provided in development variants.

One also learns from FIG. 1 that three capacitive components 12a, 12b, which are electrically connected in series and may be electrical capacitors, are provided at the respective first branch 10a, 10b of the two parallel circuits 9a, 9b. One electrical fuse element 13a, 13b in each case is provided in the second branch 11a, 11b.

The capacitive components 12a, 12b can in this case be conventional capacitors, the fuse element can be a conventional fuse component, for example in the form of a conventional electric fuse. A pulsed AC signal provided at the electrical input connector 3 of the electrical signal line 2 having a DC offset is decomposed at the input of the parallel circuits 9a, 9b in each case into an alternating-current voltage portion (AC portion) and a direct-current voltage portion (DC portion). The alternating-current voltage portion of the signal, for example in the case of a pulsed signal the rising or falling flank, is, without being influenced by the fuse element 13a, 13b, conducted via the respective first branch 10a, 10b, as the capacitive components 12a, 12b act as a high-pass filter. The direct-current voltage portion, which is more energy-rich compared to the alternating-current voltage portion, flows by contrast via the second branch 11a, 11b and thus through the fuse elements 13a, 13b. At the output of the parallel circuits 9a, 9b, the original signal form results again by means of the combination of the signals conducted via the two branches 10a, 10b, 11a, 11b, that is to say the AC signal with DC portion called pulsed by way of example. By means of the fuse elements 13a, 13b, it is then ensured in this case that the electrical energies transmitted in the signal line 2 do not exceed a maximum permissible peak value; in this case, the fuse elements 13a, 13b interrupt the electrical connection of the input connector 3 of the signal line 2 to the output connector 4. In this manner, independently of the earthing according to the invention of the signal line 2 by means of earthing lines 6a, 6b, 6c, it is additionally ensured that too high an electrical energy, which could lead to a spark ignition in an explosive area, is not supplied at the output connector 4 of the signal line 2. It is prevented by means of the capacitive components 12a, 12b provided in the first branches 10a, 10b, that the fuse element 13a, 13b acting as high-pass filter impairs or eliminates the high-frequency portions of the signal to be transmitted in an undesired manner.

The fuse elements 13a, 13b act as conventional current-limiting apparatuses, which interrupt an electrical connection between the input and the output connectors 3, 4 of the fuse element 13a, 13b in the sense of a galvanic isolation in the event of the exceeding of a predetermined maximum permissible electric current. The use of three capacitive components 12a, 12b, which are electrically connected to one another in series, constitutes a triple redundancy in the event that one or two of the respectively three capacitive components 12a, 12b should have a malfunction due to short circuit. In this case, one or two further components remain, which take over the desired high-pass filter function for data transmission. According to a simplified variant that is particularly cost-effective to produce, only two capacitive components 12a, 12b electrically connected in series or even just one single such capacitive component 12a can be provided. In advantageous developments, the number of capacitive components 12a, 12b connected in series can also be higher.

One can furthermore learn from FIG. 1 that the semiconductor switches 8a, 8b, 8c provided in the earthing line 6a, 6b, 6c can be controlled by means of a respective electrical control line 14a, 14b, 14c and switched over in this manner between the open and the closed state. The respective semiconductor switch 8a, 8b, 8c can for example be constructed in the manner of a FET transistor in each case, the gate connector (G) of which is electrically connected to the control line 14a, 14b, 14c, the source connector (S) of which is electrically connected to the signal line 2 or the drain connector (D) of which is electrically connected to the earth line 5. Of course, other types of semiconductor switches 6a, 6b, 6c, particularly other types of transistors, for example bipolar transistors, are conceivable for use in the circuit arrangement 1. The use of a mechanical switch in the manner of a relay is also fundamentally conceivable. The control voltage provided at the gate connector (G) for controlling the FET transistor can be set in a known manner by means of suitable electrical resistances in the manner of a voltage divider circuit. In the control circuit shown in FIG. 1, the voltage division is realised with conventional ohmic resistances R, which are dimensioned in such a manner that the desired electrical control voltage is applied at the gate connector (G).

The electronic circuit arrangement 1 can be part of an electronic circuit system 20, which comprises a control unit 21, particularly of a microcontroller type, by means of which the semiconductor switches 8a, 8b, 8c can be controlled via the control lines 14a, 14b, 14c and thus switched over between the open and the closed state.

The conventional circuit arrangement 1, but also the electronic circuit arrangement 20 including the control unit 21 can be part of an electronic device, particularly of a computer or mobile telephone, and comprise an external interface, on which the output connector 4 of the signal line 2 is provided.

The invention claimed is:

1. An electronic circuit arrangement for use in an explosive area, comprising:
   an electrical signal line, which connects an electrical input connector to an electrical output connector, a pulsed alternating current signal being provided at the electrical input connector, and
   an electrical earth line, which is electrically connectable to the electrical signal line by at least one electrical earthing line,
   wherein an inductive component and a semiconductor switch are arranged in the at least one earthing line, and
   wherein the semiconductor switch is switchable between a closed state, in which the signal line is electrically connected via the at least one earthing line to the earth line, and an open state, in which the electrical connection is interrupted.

2. The electronic circuit arrangement according to claim 1, wherein the semiconductor switch comprises a transistor.

3. The electronic circuit arrangement according to 2, wherein three earthing lines are provided.

4. The electronic circuit arrangement according to claim 2, wherein:
   at least one parallel circuit having a first and a second branch is provided in the signal line, and
   at least one capacitive component is arranged in the first branch and a fuse element is arranged in the second branch.

5. The electronic circuit arrangement according to claim 4, wherein the fuse element is constructed as a current-limiting apparatus, and is configured to galvanically isolate the input connector of the signal line from the output connector if the electric current flowing through the fuse element exceeds a predetermined maximum value.

6. The electronic circuit arrangement according to claim 4, wherein two parallel circuits electrically connected in series are provided in the signal line.

7. The electronic circuit arrangement according to claim 4, wherein three capacitive elements connected in series are arranged in at least one of the first and the second branch.

8. The electronic circuit arrangement according to claim 1, wherein three earthing lines are provided.

9. The electronic circuit arrangement according to claim 8, wherein:
   at least one parallel circuit having a first and a second branch is provided in the signal line, and
   at least one capacitive component is arranged in the first branch and a fuse element is arranged in the second branch.

10. The electronic circuit arrangement according to claim 9, wherein two parallel circuits electrically connected in series are provided in the signal line.

11. The electronic circuit arrangement according to claim 9, wherein three capacitive elements connected in series are arranged in at least one of the first and the second branch.

12. The electronic circuit arrangement according to claim 1, wherein:
- at least one parallel circuit having a first and a second branch is provided in the signal line, and
- at least one capacitive component is arranged in the first branch and a fuse element is arranged in the second branch.

13. The electronic circuit arrangement according to claim 12, wherein the fuse element is constructed as a current-limiting apparatus, and is configured to galvanically isolate the input connector of the signal line from the output connector if the electric current flowing through the fuse element exceeds a predetermined maximum value.

14. The electronic circuit arrangement according to claim 12, wherein two parallel circuits electrically connected in series are provided in the signal line.

15. The electronic circuit arrangement according to claim 12, wherein three capacitive elements connected in series are arranged in at least one of the first and the second branch.

16. The electronic circuit arrangement according to claim 1, wherein the semiconductor switch is switchable between the open and the closed state by an electrical control line.

17. The electronic circuit arrangement according to claim 1, wherein the semiconductor switch is a field-effect transistor having a gate connector, a source connector, and a drain connector, at least one of which is electrically connected to the control line.

18. An electronic switching system comprising:
an electronic circuit arrangement having:
- an electrical signal line, which connects an electrical input connector to an electrical output connector, a pulsed alternating current signal being provided at the electrical input connector,
- an electrical earth line, which is electrically connectable to the electrical signal line by at least one electrical earthing line, and
- an inductive component and a semiconductor switch arranged in the at least one earthing line, the semiconductor switch being switchable between a closed state, in which the signal line is electrically connected via the at least one earthing line to the earth line, and an open state, in which the electrical connection is interrupted, and
a control unit by which the semiconductor switch is controllable for switching over between the open and the closed state.

19. An electronic device comprising:
an electronic circuit arrangement having:
- an electrical signal line, which connects an electrical input connector to an electrical output connector, an alternating current signal being provided at the electrical input connector,
- an electrical earth line, which is electrically connectable to the electrical signal line by at least one electrical earthing line, and
- an inductive component and a semiconductor switch arranged in the at least one earthing line, the semiconductor switch being switchable between a closed state, in which the signal line is electrically connected via the at least one earthing line to the earth line, and an open state, in which the electrical connection is interrupted,
- at least one parallel circuit having a first and a second branch provided in the signal line, the alternating current signal being decomposed at an input of the parallel circuit into an alternating current portion and a direct current portion, and an external interface on which the output connector of the signal line is provided.

20. The electronic device according to claim 19, further comprising a control unit configured to control the semiconductor switch for switching over between the open and the closed state.

* * * * *